United States Patent
Jung et al.

(10) Patent No.: US 10,249,732 B1
(45) Date of Patent: Apr. 2, 2019

(54) MANUFACTURING METHOD OF SEMICONDUCTOR DEVICE TO UNIFORMLY FORM THICKNESS OF GATE INSULATING LAYER

(71) Applicants: Hyundai Motor Company, Seoul (KR); Kia Motors Corporation, Seoul (KR)

(72) Inventors: Youngkyun Jung, Seoul (KR); NackYong Joo, Gyeonggi-do (KR); Junghee Park, Gyeonggi-do (KR); Hyun Woo Noh, Seoul (KR); JongSeok Lee, Gyeonggi-do (KR); Dae Hwan Chun, Gyeonggi-do (KR)

(73) Assignees: Hyundai Motor Company, Seoul (KR); Kia Motors Corporation, Seoul (KR)

(*) Notice: Subject to any disclaimer, the term of this patent is extended or adjusted under 35 U.S.C. 154(b) by 0 days.

(21) Appl. No.: 15/823,856

(22) Filed: Nov. 28, 2017

(30) Foreign Application Priority Data

Oct. 19, 2017 (KR) .......................... 10-2017-0136004

(51) Int. Cl.
| | |
|---|---|
| *H01L 21/76* | (2006.01) |
| *H01L 29/66* | (2006.01) |
| *H01L 21/308* | (2006.01) |
| *H01L 21/3065* | (2006.01) |
| *H01L 29/423* | (2006.01) |

(52) U.S. Cl.
CPC ...... *H01L 29/66666* (2013.01); *H01L 21/308* (2013.01); *H01L 21/3065* (2013.01); *H01L 29/4236* (2013.01)

(58) Field of Classification Search
CPC ........... H01L 29/66666; H01L 29/4236; H01L 21/308; H01L 21/3065

USPC ......................................................... 438/270
See application file for complete search history.

(56) References Cited

U.S. PATENT DOCUMENTS

| | | | | |
|---|---|---|---|---|
| 2012/0049202 | A1* | 3/2012 | Nakano | H01L 29/7813 257/77 |
| 2015/0115335 | A1* | 4/2015 | Wang | H01L 29/78 257/288 |
| 2016/0163843 | A1* | 6/2016 | Huang | H01L 29/7851 257/24 |

FOREIGN PATENT DOCUMENTS

| | | |
|---|---|---|
| JP | 2005-056868 A | 3/2005 |
| KR | 2011-0108887 A | 10/2011 |
| KR | 10-1649570 B1 | 8/2016 |

* cited by examiner

*Primary Examiner* — Anthony Ho
*Assistant Examiner* — Mohammad M Hoque
(74) *Attorney, Agent, or Firm* — Mintz Levin Cohn Ferris Glovsky and Popeo, P.C.; Peter F. Corless

(57) ABSTRACT

A manufacturing method of a semiconductor device is provided. The method includes sequentially forming an n− type of layer, a p type of region, and an n+ type of region on a first surface of a substrate, forming a preliminary trench in the n− type of layer by a first etching process and forming a preliminary gate insulating layer by a first thermal oxidation process. The method includes etching the lower surface of the preliminary trench and the preliminary second portion to form a trench by a second etching process and forming a gate insulating layer in the trench by a second thermal oxidation process. The gate insulating layer includes a first and second portion. The preliminary first portion is thicker than the preliminary second portion and the first portion. The first portion thickness is equal to the thickness of the second portion.

10 Claims, 8 Drawing Sheets

MANUFACTURING METHOD OF SEMICONDUCTOR DEVICE TO UNIFORMLY FORM THICKNESS OF GATE INSULATING LAYER

CROSS-REFERENCE TO RELATED APPLICATION

This application claims priority to and the benefit of Korean Patent Application No. 10-2017-0136004 filed on Oct. 19, 2017, the entire contents of which are incorporated herein by reference.

BACKGROUND

(a) Technical Field of the Disclosure

The present disclosure relates to a manufacturing method of a semiconductor device, and more particularly, to a method that may uniformly form a thickness of a gate insulating layer of a trench gate MOSFET.

(b) Description of the Related Art

Recently, technological development trends have generated an interest in large-sized and large-capacity application apparatuses, a power semiconductor device having a high breakdown voltage, a high current capacity, and high-speed switching characteristics have become necessary. Typically, a power semiconductor device, a low on-resistance or a low saturated voltage is required to reduce power loss in a conduction state when a substantial amount of current flows. Additionally, a characteristic of being able to sustain a backward high voltage of a PN junction (e.g., a p-type on one side and a n-type on the other side) which is applied to opposite ends of the power semiconductor device in an off state or when the switch is turned off, that is, a high breakdown voltage characteristic, is required. In a digital circuit and an analog circuit, a metal oxide semiconductor field effect transistor (MOSFET) among the power semiconductor devices is commonly used as a field effect transistor.

Conversely, a trench gate MOSFET has been researched in which a JFET region of a planar gate MOSFET is removed to reduce on-resistance and increase current density. When the trench gate MOSFET is used, after forming a trench, a gate insulating layer is formed on bottom and lateral surfaces of the trench. Generally, a silicon dioxide ($SiO_2$) layer formed by a thermal oxidation process is used for the gate insulating layer. However, during the thermal oxidation process, a thickness of the gate insulating layer may be unevenly formed due to a difference in oxidation rate between the lateral surface and the bottom surface of the trench.

The above information disclosed in this section is merely for enhancement of understanding of the background of the disclosure and therefore it may contain information that does not form the prior art that is already known in this country to a person of ordinary skill in the art.

SUMMARY

The present disclosure provides a method that may uniformly form a thickness of a gate insulating layer of a trench gate MOSFET.

In an aspect of an exemplary embodiment of the present disclosure a manufacturing method of a semiconductor device may include sequentially forming an n− type of layer, a p type of region, and an n+ type of region on a first surface of a substrate, forming a preliminary trench including a lower surface upwardly convex with respect to the first surface of the substrate in the n− type of layer by performing a first etching process, forming a preliminary gate insulating layer including a preliminary first portion positioned at a lateral surface of the preliminary trench and a preliminary second portion positioned at a lower surface of the preliminary trench by performing a first thermal oxidation process, etching the lower surface of the preliminary trench and the preliminary second portion to form a trench by performing a second etching process and forming a gate insulating layer in the trench by performing a second thermal oxidation process. The gate insulating layer may include a first portion positioned at a lateral surface of the trench and a second portion positioned at a lower surface of the trench. A thickness of the preliminary first portion may be greater than a thickness of the preliminary second portion. The thickness of the preliminary first portion may be greater than a thickness of the first portion. The thickness of the first portion may be the same as a thickness of the second portion.

In some exemplary embodiments, the second etching process may include etching a portion of the preliminary first portion to form the first portion. The second thermal oxidation process may include forming the second portion. In other exemplary embodiments, at least one of chlorine gas ($Cl_2$) and carbon tetrafluoride ($CF_4$) may be used in the first etching process. At least one of sulfur hexafluoride ($SF_6$), oxygen gas ($O_2$), and argon (Ar) may be used in the second etching process.

Additionally, a gas injection pressure of the first etching process may be greater than a gas injection pressure of the second etching process. In another exemplary embodiment, the RF power (e.g., radio frequency power) of the first etching process may be greater than the RF power of the second etching process. The substrate may be an n+ type of silicon carbide substrate. The preliminary gate insulating layer and the gate insulating layer may include a silicon oxide.

In some exemplary embodiments, the manufacturing method of the semiconductor device may further include, forming a gate electrode on the gate insulating layer, forming an oxide layer on the gate electrode and the n+ type of region, forming a source electrode on the oxide layer and the n+ type of region, and forming a drain electrode on the second surface opposite to the first surface of the substrate.

According to an exemplary embodiment of the present disclosure, a more uniform a thickness of a gate insulating layer may be formed by performing a first etching process, a first thermal oxidation process, a second etching process, and a second thermal oxidation process. Accordingly, an operation failure of a semiconductor device may be prevented.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

Figure 1:
FIG. 1 illustrates an exemplary cross-sectional view of a semiconductor device according to an exemplary embodiment of the present disclosure.

The present disclosure will be described more fully hereinafter with reference to the accompanying drawings, in which exemplary embodiments of the disclosure are shown. However, it is to be understood that the disclosure is not limited to the disclosed embodiments, but, on the contrary, is intended to cover various modifications. As those skilled in the art would realize, the described embodiments may be modified in various different ways, all without departing from the spirit or scope of the present disclosure.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. As used herein, the term "and/or" includes any and all combinations of one or more of the associated listed items. For example, in order to make the description of the present disclosure clear, unrelated parts are not shown and, the thicknesses of layers and regions are exaggerated for clarity. Further, when it is stated that a layer is "on" another layer or substrate, the layer may be directly on another layer or substrate or a third layer may be disposed therebetween.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

It is understood that the term "vehicle" or "vehicular" or other similar term as used herein is inclusive of motor vehicle in general such as passenger automobiles including sports utility vehicles (SUV), buses, trucks, various commercial vehicles, watercraft including a variety of boats, ships, aircraft, and the like and includes hybrid vehicles, electric vehicles, combustion, plug-in hybrid electric vehicles, hydrogen-powered vehicles and other alternative fuel vehicles (e.g. fuels derived from resources other than petroleum).

FIG. 1 illustrates an exemplary cross-sectional view of a semiconductor device according to an exemplary embodiment of the present disclosure. Referring to FIG. 1, a semiconductor device according to the present e embodiment includes a substrate that may include 100, an n− type of layer 200, a p type of region 300, an n+ type of region 400, a trench 500, a gate insulating layer 600, a gate electrode 700, a source electrode 800, and a drain electrode 900. The substrate 100 may be an n+ type of silicon carbide substrate. The n− type of layer 200 may be disposed on a first surface of the substrate 100, the p type of region 300 may be disposed on the n− type of layer 200, and the n+ type of region 400 may be disposed on the p type region 300.

The trench 500 passes through the p type of region 300 and the n+ type of region, and may be disposed on the n− type of layer 200. Thus, the p type of region 300 and n+ type of region may be disposed on a lateral surface of the trench 500. The gate insulating layer 600 may be disposed in the trench 500. The gate insulating layer 600 may include a first portion 610 and a second portion 620. The first portion 610 may be disposed on a lateral surface of the trench 500, and the second portion 620 may be disposed on a lower surface of the trench 500. A thickness of the first portion 610 may be the equal to a thickness of the second portion 620. In particular, the thickness of the first portion 610 may be measured in a direction perpendicular to the lateral surface of the trench 500, and the thickness of the second portion 620 may be measured in a direction perpendicular to the lower surface of the trench 500. The gate insulating layer 600 may include a silicon oxide ($SiO_x$).

The gate electrode 700 may be disposed on the gate insulating layer 600. The gate electrode 700 may include a poly-crystalline silicon or a metal. The trench 500 may be filled with the gate electrode 700. Although not shown in the exemplary embodiment, a part of the gate electrode 700 may protrude outside the trench 500. An oxide layer 710 may be disposed on the gate electrode 700, the gate insulating layer 600, and the n type of region 400. The oxide layer 710 may include a silicon oxide ($SiO_x$). The source electrode 800 may be disposed on the oxide layer 710 and the n type of region 400, and the drain electrode 900 may be disposed on a second surface of the substrate 100. In particular, the second surface of the substrate 100 may be opposite to the first surface of the substrate 100. The source electrode 800 and the drain electrode 900 may include an ohmic metal.

Figure 2:
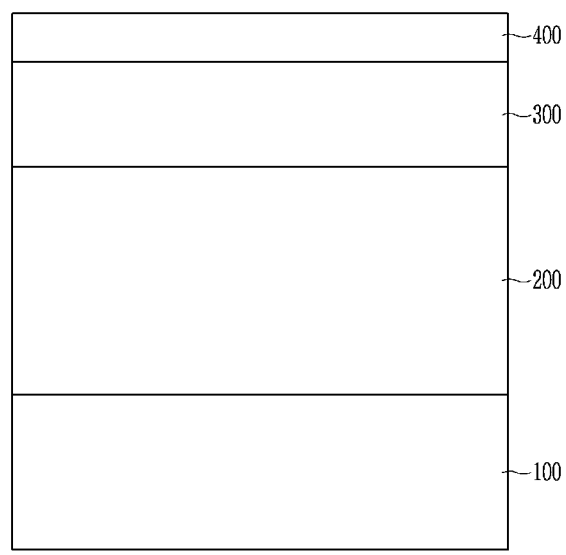
FIG. 2 to FIG. 8 illustrate exemplary processing diagrams of a manufacturing method of a semiconductor device according to an exemplary embodiment of the present disclosure.

Hereinafter, a manufacturing method of a semiconductor device according to an exemplary embodiment of the present disclosure will be described with reference to FIG. 2 to FIG. 8 and FIG. 1. FIG. 2 to FIG. 8 illustrate exemplary processing diagrams of a manufacturing method of a semiconductor device according to an exemplary embodiment of the present disclosure. Referring to FIG. 2, the substrate 100 may be prepared, and then an n− type of epitaxial layer 200 may be formed on the first surface of the substrate 100 by epitaxial growth. Herein, the substrate 100 may be an n+ type of silicon carbide substrate.

Figure 3:
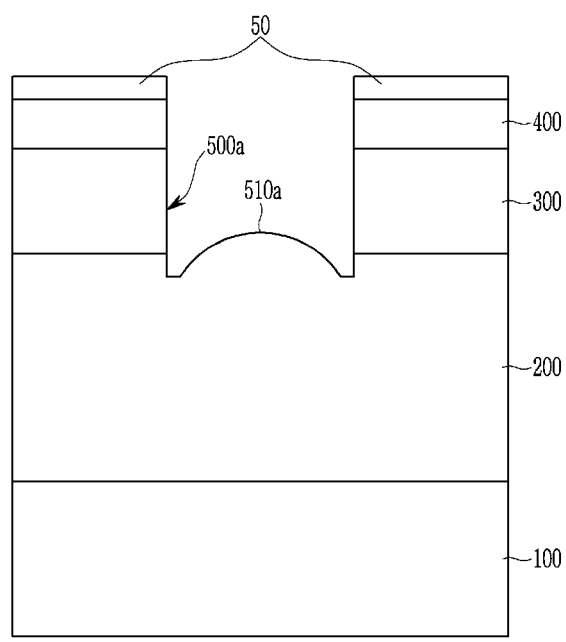

Referring to FIG. 3, the p type of region 300 is formed on the n− type of layer 200, and the n type of region 400 may be formed on the p type of region 300. Herein, each of the p type of region 300 and the n+ type of region 400 may be formed by epitaxial growth. In other words, the p type of region 300 may be formed on the n− type of layer 200 by the epitaxial growth, and then the n type of region 400 may be formed on the p type of region 300 by the epitaxial growth. However, the present disclosure is not limited thereto, and the p type of region 300 may be formed by injecting p ions such as boron (B), aluminum (Al), gallium (Ga), and indium (In) into the n− type of layer 200, and the n+ type of region 400 may be formed by injecting n ions such as nitrogen (N), phosphorus (P), arsenic (As), and antimony (Sb) into the p type of region 300. Herein, a concentration of the n ions included in the n type of region 400 may be greater than a concentration of the n ions included in the n− type of layer 200.

Figure 4:
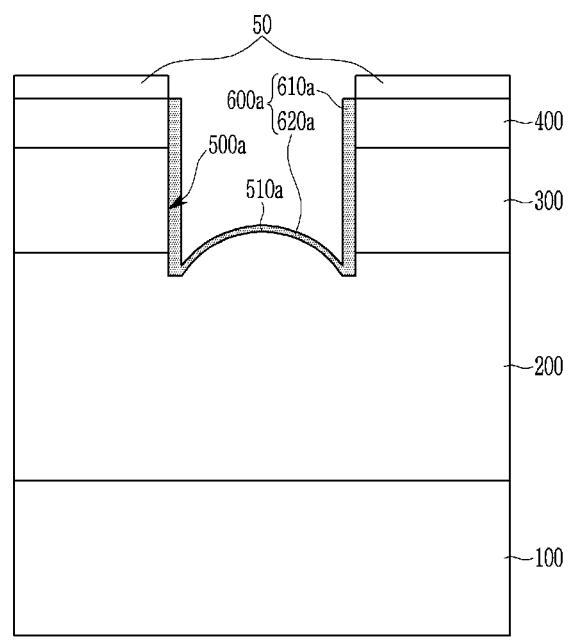

Referring to FIG. 4, a preliminary trench 500a may be formed by performing a first etching process. The n type of region 400, the p type of region 300, and the n− type of layer 200 may be etched by the first etching process. The preliminary trench 500a passes through the n+ type of region 400 and the p type of region 300, and may be formed at the n− type of layer 200. Herein, a lower surface 510a of the preliminary trench 500a may be formed to be upwardly convex with respect to the first surface of the substrate 100. Accordingly, a groove may be formed between the lower surface 510a and a lateral surface of the preliminary trench 500a, and the small groove may be referred to as a microtrench.

A mask pattern 50 may be formed on the n+ type of region 400 by the first etching process, and the n+ type of region 400, the p type of region 300, and the n− type of layer 200 may be etched by using the mask pattern 50 as a mask. Herein, the mask pattern 50 may include a silicon oxide ($SiO_x$). The first etching process may be a dry etching process using etching gas, and the etching gas may include at least one of chlorine gas ($Cl_2$) and carbon tetrafluoride ($CF_4$). In the first etching process, by adjusting pressure and RF power for injecting the etching gas, the preliminary trench 500a may be formed to have the lower surface 510a formed to be upwardly convex with respect to the first surface of the substrate 100.

Figure 5:
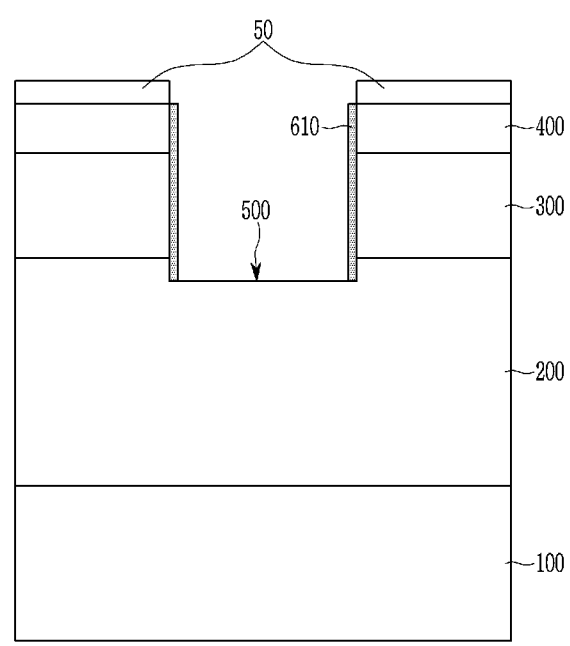

Referring to FIG. 5, a preliminary gate insulating layer 600a may be formed in the preliminary trench 500a by performing a first thermal oxidation process. The preliminary gate insulating layer 600a may include a silicon oxide ($SiO_x$). The preliminary gate insulating layer 600a may include a preliminary first portion 610a and a preliminary second portion 620a. The preliminary first portion 610a may be disposed at the lateral surface of the preliminary trench 500a, and the preliminary second portion 620a may be disposed at the lower surface 510a of the preliminary trench 500a. A thickness of the preliminary first portion 610a may be greater than that of the preliminary second portion 620a. Herein, the thickness of the preliminary first portion 610a may be measured in a direction perpendicular to the lateral surface of the preliminary trench 500a, and the thickness of the preliminary second portion 620a may be measured in a direction perpendicular to the lower surface of the preliminary trench 500a.

Oxygen or water vapor reacts with silicon atoms of silicon carbide (SiC) of a surface of the preliminary trench 500a due to the first thermal oxidation process to form a silicon oxide layer on the lateral surface and the lower surface 510a of the preliminary trench 500a. In particular, carbon atoms of the silicon carbide may react with oxygen to generate gases such as carbon monoxide (CO) and carbon dioxide ($CO_2$), which are then removed. The silicon oxide layer may form the preliminary gate insulating layer 600a.

Generally, the silicon carbide may have anisotropy of various physical properties based on a direction of a crystal plane thereof, its oxidation rate may vary based on the crystal plane, and an oxidation rate at the lateral surface of the preliminary trench 500a may be greater than that at the lower surface 510a of the preliminary trench 500a. Accordingly, the thickness of the preliminary first portion 610a positioned at the lateral surface of the preliminary trench 500a may be formed to be greater than that of the preliminary second portion 620a disposed at the lower surface 510a of the preliminary trench 500a.

Figure 6:
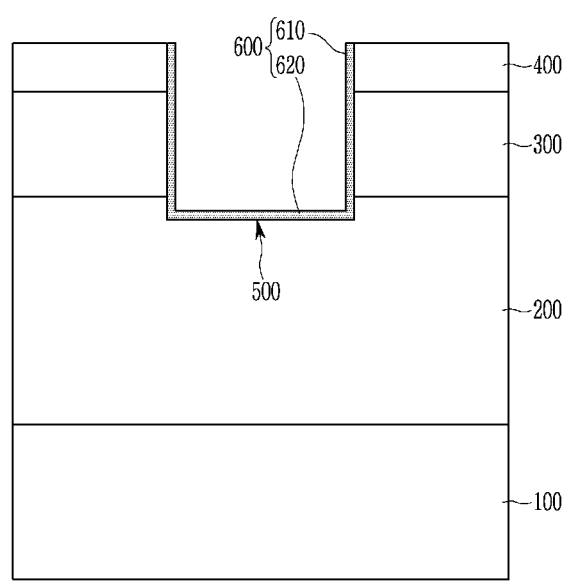

Referring to FIG. 6, the trench 500 and the first portion 610 of the gate insulating layer 600 may be formed by performing a second etching process. A portion of the preliminary first portion 610a of the preliminary gate insulating layer 600a and the lower surface 510a of the preliminary trench 500a may be etched by the second etching process. When the lower surface 510a of the preliminary trench 500a is etched, the preliminary second portion 620a of the preliminary gate insulating layer 600a may be etched and removed. Accordingly, the lower surface of the trench 500 may be flattened. A portion of the preliminary first portion 610a of the preliminary gate insulating layer 600a may be etched to be the first portion 610 of the gate insulating layer 600 described later. Thus, a thickness of the first portion 610 of the gate insulating layer 600 may be less than that of the preliminary first portion 610a of the preliminary gate insulating layer 600a.

The second etching process may be a dry etching process formed using etching gas, and may use at least one of sulfur hexafluoride ($SF_6$), oxygen gas ($O_2$), and argon (Ar) as the etching gas. In the second etching process, by controlling pressure and RF power for injecting the etching gas, the preliminary first portion 610a of the preliminary gate insulating layer 600a and the lower surface 510a of the preliminary trench 500a may be etched. In particular, the pressure for injecting the etching gas in the second etching process may be greater than that for injecting the etching gas in the first etching process. In addition, the RF power of the second etching process may be greater than that of the first etching process.

Figure 7:
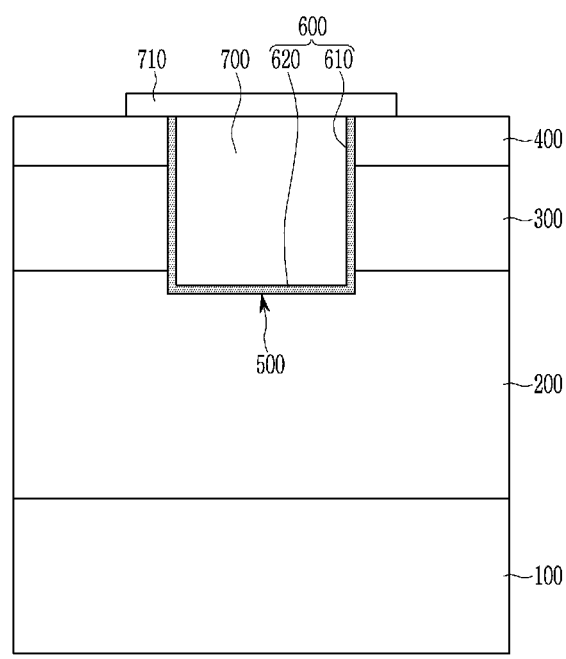

Referring to FIG. 7, the second portion 620 of the gate insulating layer 600 may be formed at the lower surface of the trench 500 by performing a second thermal oxidation process to complete the gate insulating layer 600 and remove the mask pattern 50. In other words, the gate insulating layer 600 may include the first portion 610 disposed at the lateral surface of the trench 500 and the second portion 620 disposed at the lower surface of the trench 500. Herein, the thickness of the first portion 610 may be equal to the second portion 620.

In the second thermal oxidation process, oxygen or water vapor may react with silicon atoms of a silicon carbide of the lower surface of the trench 500 to form a silicon oxide layer on the lower surface of the trench 500. In particular, carbon atoms of the silicon carbide may react with oxygen to generate gases including carbon monoxide (CO) and carbon dioxide ($CO_2$), which are then removed. The silicon oxide layer may form the second portion 620 of the gate insulating layer 600. For example, when the first portion 610 of the gate insulating layer 600 is positioned at the lateral surface of the trench 500, the second thermal oxidation process may be performed, and the lateral surface of the trench 500 and the first portion 610 of the gate insulating layer 600 may not undergo an oxidation reaction. Accordingly, by performing the first etching process, the first thermal oxidation process, the second etching process, and the second thermal oxidation process, the thickness of the gate insulating layer 600 may be formed more uniformly.

Figure 8:
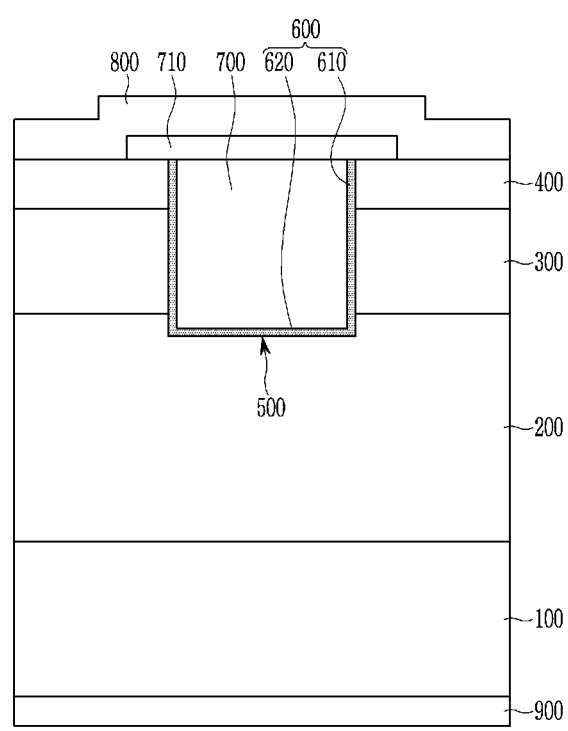

Referring to FIG. 8, the gate electrode 700 may be formed on the gate insulating layer 600 in the trench 500, and the oxide layer 710 may be formed on the gate electrode 700, the gate insulating layer 600, and the n+ type of region 400. The gate electrode 700 may include a poly-crystalline silicon or metal. The trench 500 may be filled with the gate electrode 700. The oxide layer 710 may include a silicon oxide ($SiO_x$).

Referring to FIG. 1, the source electrode 800 may be formed on the oxide layer 710 and the n+ type of region 400, and the drain electrode 900 may be formed on the second surface of the substrate 100. For example, the second surface of the substrate 100 may be disposed opposite to the first surface of the n+ type of silicon carbide substrate 100. The source electrode 800 and the drain electrode 900 may include an ohmic metal. As described above, since the thickness of the gate insulating layer 600 may be uniformly formed, an operation failure of the semiconductor device may be prevented.

While this disclosure has been described in connection with what is presently considered to be exemplary embodiments, it is to be understood that the disclosure is not limited to the disclosed exemplary embodiments, but, on the contrary, is intended to cover various modifications and equivalent arrangements included within the spirit and scope of the appended claims.

DESCRIPTION OF SYMBOLS

50: mask pattern
100: substrate
200: n− type of layer
300: p type of region
400: n+ type of region
500: trench
500*a*: preliminary trench
510*a*: lower surface of preliminary trench
600: gate insulating layer
610: first portion
620: second portion
600*a*: preliminary gate insulating layer
610*a*: preliminary first portion
620*a*: preliminary second portion
700: gate electrode
710: oxide layer
800: source electrode
900: drain electrode

What is claimed is:

1. A manufacturing method of a semiconductor device, comprising:
   sequentially forming an n− type of layer, a p type of region, and an n+ type of region on a first surface of a substrate;
   forming a preliminary trench including a lower surface upwardly convex with respect to the first surface of the substrate in the n− type of layer by performing a first etching process;
   forming a preliminary gate insulating layer including a preliminary first portion disposed at a lateral surface of the preliminary trench and a preliminary second portion disposed at the lower surface of the preliminary trench by performing a first thermal oxidation process;
   etching the lower surface of the preliminary trench and the preliminary second portion to form a trench by performing a second etching process; and
   forming a gate insulating layer in the trench by performing a second thermal oxidation process,
   wherein the gate insulating layer includes a first portion disposed at a lateral surface of the trench and a second portion disposed at a lower surface of the trench,
   wherein a thickness of the preliminary first portion is greater than a thickness of the preliminary second portion,
   wherein the thickness of the preliminary first portion is greater than a thickness of the first portion,
   wherein the thickness of the first portion is the same as a thickness of the second portion, and
   wherein the thickness of the second portion is uniform.

2. The manufacturing method of the semiconductor device of claim 1, wherein the second etching process includes etching a portion of the preliminary first portion to form the first portion.

3. The manufacturing method of the semiconductor device of claim 2, wherein the second thermal oxidation process includes forming the second portion.

4. The manufacturing method of the semiconductor device of claim 3, wherein at least one of chlorine gas ($Cl_2$) and carbon tetrafluoride ($CF_4$) is used in the first etching process.

5. The manufacturing method of the semiconductor device of claim 4, wherein at least one of sulfur hexafluoride ($SF_6$), oxygen gas ($O_2$), and argon (Ar) is used in the second etching process.

6. The manufacturing method of the semiconductor device of claim 5, wherein a first gas injection pressure of the first etching process is greater than a second gas injection pressure of the second etching process.

7. The manufacturing method of the semiconductor device of claim 6, wherein a first radio frequency power of the first etching process is greater than a second radio frequency power of the second etching process.

8. The manufacturing method of the semiconductor device of claim 1, wherein the substrate is an n+ type of silicon carbide substrate.

9. The manufacturing method of the semiconductor device of claim 8, wherein the preliminary gate insulating layer and the gate insulating layer include a silicon oxide.

10. The manufacturing method of the semiconductor device of claim 1, further comprising:
    forming a gate electrode on the gate insulating layer;
    forming an oxide layer on the gate electrode and the n+ type of region;
    forming a source electrode on the oxide layer and the n+ type of region; and
    forming a drain electrode on the second surface opposite to the first surface of the substrate.

* * * * *